United States Patent
Yeh et al.

(10) Patent No.: US 8,088,294 B2
(45) Date of Patent: Jan. 3, 2012

(54) METHOD FOR MANUFACTURING PRINTED CIRCUIT BOARDS

(75) Inventors: Tso-Hung Yeh, Taoyuan (TW); Hung-Yi Chang, Taoyuan (TW); Chia-Cheng Chen, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 919 days.

(21) Appl. No.: 12/110,542

(22) Filed: Apr. 28, 2008

(65) Prior Publication Data

US 2009/0050600 A1    Feb. 26, 2009

(30) Foreign Application Priority Data

Aug. 24, 2007   (CN) .................... 2007 1 0076564

(51) Int. Cl.
*H01B 13/00* (2006.01)
(52) U.S. Cl. .................. 216/13; 216/48; 216/67; 216/78
(58) Field of Classification Search .................. None
See application file for complete search history.

(56) References Cited

U.S. PATENT DOCUMENTS

| | | | | |
|---|---|---|---|---|
| 4,091,125 A | * | 5/1978 | Delgadillo | 427/98.5 |
| 5,447,619 A | * | 9/1995 | Wolski et al. | 205/50 |
| 5,861,076 A | * | 1/1999 | Adlam et al. | 156/281 |
| 5,989,727 A | * | 11/1999 | Yates et al. | 428/607 |
| 7,026,436 B2 | * | 4/2006 | Kanakarajan | 528/310 |
| 7,285,321 B2 | * | 10/2007 | Kanakarajan et al. | 428/209 |
| 7,367,114 B2 | * | 5/2008 | Rybka et al. | 29/623 |
| 2002/0148816 A1 | * | 10/2002 | Jung et al. | 219/121.41 |
| 2004/0034993 A1 | * | 2/2004 | Rybka et al. | 29/623 |
| 2006/0115670 A1 | * | 6/2006 | Tanaka et al. | 428/615 |
| 2007/0169886 A1 | * | 7/2007 | Watanabe et al. | 156/325 |
| 2007/0260035 A1 | * | 11/2007 | Watanabe | 528/353 |
| 2010/0311901 A1 | * | 12/2010 | Kanakarajan et al. | 524/606 |

FOREIGN PATENT DOCUMENTS

| CN | 02803127 C | 10/2005 |
|---|---|---|
| CN | 1913749 A | 2/2007 |

* cited by examiner

Primary Examiner — Allan Olsen
(74) Attorney, Agent, or Firm — Altis Law Group, Inc.

(57) ABSTRACT

An exemplary method for manufacturing printed circuit boards is provided. In the method, a copper clad substrate having a copper layer thereon is provided. A surface of the copper layer is roughened by applying an atmospheric pressure plasma thereto. A photoresist layer is formed on the roughened surface of the copper layer. The photoresist layer is exposed. The photoresist layer is developed to form a patterned photoresist layer, thereby exposing portions of the copper layer. The exposed portions of the copper layer exposed are removed so that the remaining portions of the copper layer form electrical traces. The patterned photoresist layer is removed.

19 Claims, 3 Drawing Sheets

Providing a copper clad substrate having a copper layer thereon

Roughening a surface of the copper layer by applying an atmospheric pressure plasma thereto Forming a photoresist layer on the roughened surface of the copper layer Exposing the photoresist layer; developing the photoresist layer to form a patterned photoresist layer, thereby exposing portions of the copper layer Removing the exposed portions of the copper layer so that the remaining portions of the copper layer forms electrical traces Removing the patterned photoresist layer

FIG. 1

METHOD FOR MANUFACTURING PRINTED CIRCUIT BOARDS

BACKGROUND

1. Technical Field

The present invention relates to printed circuit boards, particularly to a method for manufacturing printed circuit boards.

2. Description of Related Art

Printed circuit boards are widely used in electronic products for electrical connection. Typically, printed circuit boards are manufactured using a series of wet processes (i.e., processes of treating printed circuit boards with treatment liquids). The wet processes generally include coating a photoresist layer on a copper layer of a copper clad substrate, developing the photoresist layer to form a patterned photoresist layer, etching the copper layer exposed from the patterned photoresist layer to form electrical traces, removing the patterned photoresist layer, and so on.

However, during the processes of manufacturing printed circuit boards, the surfaces contacting with the treatment liquids (e.g., a surface of the copper layer of the copper clad substrate, a surface of the photoresist layer, etc.) usually has some performance defects due to contaminations or oxides thereon. Thus, the surfaces have a large liquid contact angle. In the aforementioned wet processes, when the treatment liquids contact with the surfaces, an affinity of the treatment liquids to the surfaces is poor which result in the treatment liquid not being able to spread on and wet the surfaces completely. The treatment liquids act on the surfaces in a low efficiency. Therefore, quality of the printed circuit boards manufactured using these wet processes is low.

For example, in the wet process of coating the photoresist layer on the surface of the copper layer of the copper clad substrate, a liquid photoresist is applied on and contact the surface of the copper layer. The surface of the copper layer generally has a large liquid contact angle due to an oxidation film formed thereon and organic contaminations deposited thereon. During the wet process of applying the liquid photoresist on the surface of the copper layer to form the photoresist layer, an affinity of the liquid photoresist to the surface of the copper layer is poor. Thus, the liquid photoresist cannot spread on and wet the surface of the copper layer completely, thereby forming a barrier layer between the liquid photoresist and the surface of the copper layer. Because of the barrier layer, the photoresist layer formed cannot contact the surface of the copper layer tightly. As a result, the patterned photoresist layer formed on the basis of the photoresist layer may has a poor precision.

Furthermore, in the wet process of developing the photoresist layer, a developing agent contacts the surface of the photoresist layer and reacts with the photoresist of the photoresist layer. Because the surface of the photoresist layer is usually smooth and has a large liquid contact angle, an affinity of the developing agent to the surface of the photoresist layer is poor which results in the developing agent not being able to spread on and wet the surface of the photoresist layer. Thus, the developing agent reacts with the photoresist in a low efficiency, which even causes to form the patterned photoresist layer with a poor precision. As a result, the electrical traces formed on the basis of the patterned photoresist layer may also have a poor precision, thereby affecting quality of the printed circuit board.

What is needed, therefore, is a method for manufacturing printed circuit boards so as to improve the performance of the surface of a copper clad substrate, thereby improving quality of the printed circuit board using the copper clad substrate.

SUMMARY

One present embodiment provides a method for manufacturing printed circuit boards. In the method, a copper clad substrate having a copper layer thereon is provided. A surface of the copper layer is roughened by applying an atmospheric pressure plasma thereto. A photoresist layer is formed on the roughened surface of the copper layer. The photoresist layer is exposed. The photoresist layer is developed to form a patterned photoresist layer, thereby exposing portions of the copper layer. The exposed portions of the copper layer are removed so that the remaining portions of the copper layer form electrical traces. The patterned photoresist layer is removed.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

FIG. 1 is a flow chart of a method of manufacturing printed circuit boards

DETAILED DESCRIPTION OF THE EMBODIMENTS

Embodiment will now be described in detail below with reference to the drawings.

Referring to FIG. 1, a method of manufacturing printed circuit boards includes the following steps: providing a copper clad substrate having a copper layer thereon; roughening a surface of the copper layer by applying an atmospheric pressure plasma thereto; forming a photoresist layer on the roughened surface of the copper layer; exposing the photoresist layer; developing the photoresist layer to form a patterned photoresist layer, thereby exposing portions of the copper layer; removing the exposed portions of the copper layer so that the remaining portions of the copper layer forms electrical traces; and removing the patterned photoresist layer.

Figure 2:
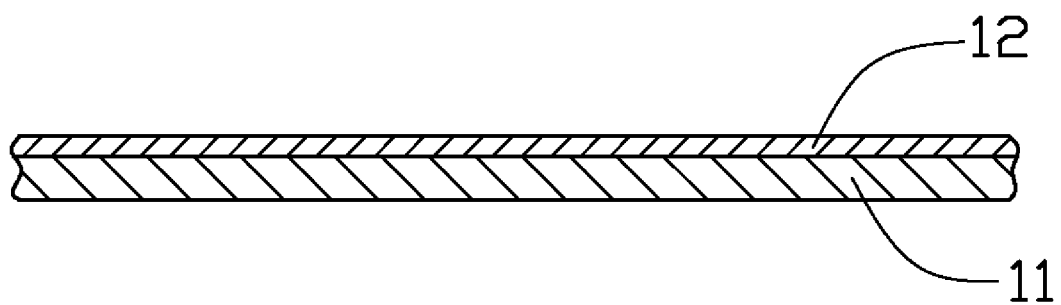
FIG. 2 is a schematic, cross-sectional view of a copper clad substrate for manufacturing printed circuit boards according to a present embodiment.

Step 1: referring to FIG. 2, a copper clad substrate 10 is provided.

The copper clad substrate 10 can be a rigid copper clad substrate or a flexible copper clad substrate. The copper clad substrate 10 can be a single-sided copper clad substrate or a double-sided copper clad substrate. The copper clad substrate 10 can be a single-layer structure or a multilayer structure containing two layers, four layers, six layers or more.

In the preferred embodiment, the copper clad substrate 10 is flexible tape-shaped copper clad substrate having a single-layer single-sided structure. A width of the copper clad substrate 10 is in a range from 20 millimeters to 75 millimeters. The copper clad substrate 10 includes an insulation base film 11 and a copper layer 12 attached on the insulation base film 11. In general, the copper layer 12 undergoes an anti-oxidation treatment, thereby forming an anti-oxidation film (not shown) on a surface of the copper layer 12. The anti-oxidation film is an organic macromolecule film and is configured for preventing the surface of the copper layer 11 from oxidation in air. The anti-oxidation film is very thin and has a thickness in a range from 3 nanometers to 20 nanometers. Additionally, the copper layer 12 without the anti-oxidation treatment may subject to contaminations by organic contaminations from air and machine.

Figure 3:
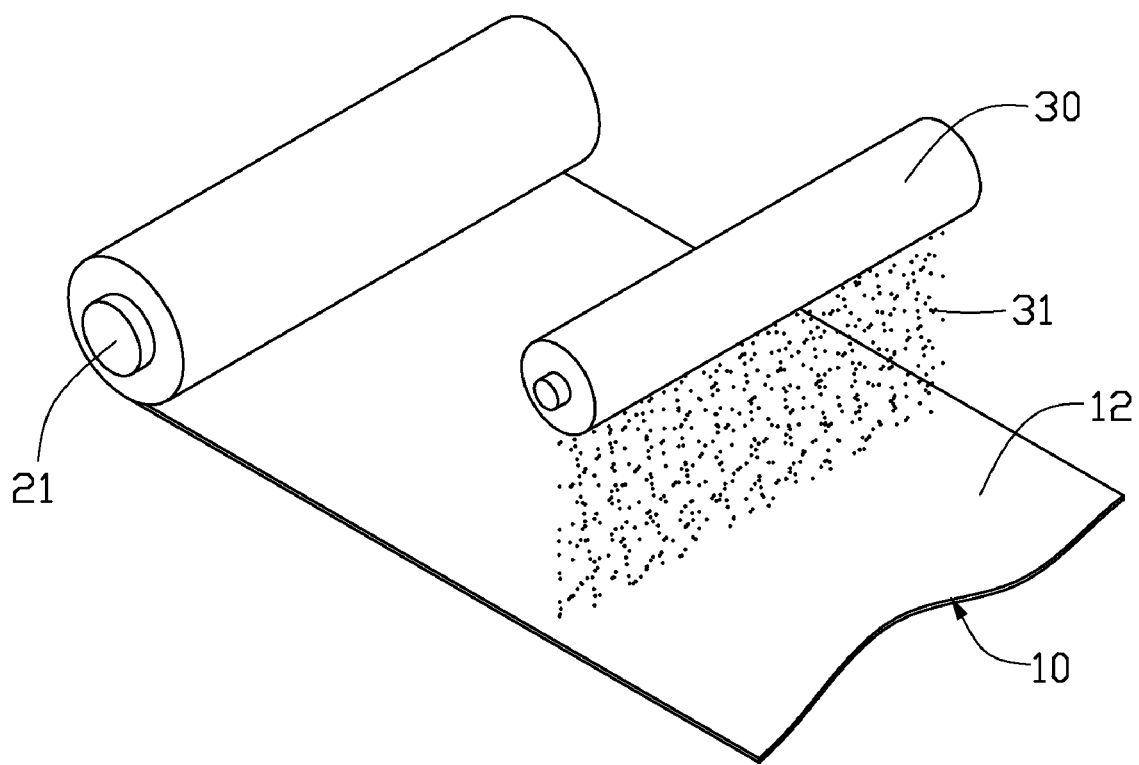
FIG. 3 is a schematic view of surface treatment of the copper clad substrate, which will contacts with a treatment liquid in a wet process of manufacturing the printed circuit board.

In the present embodiment, because the copper clad substrate 10 is a flexible tape-shaped substrate, a number of printed circuit boards are made of the copper clad substrate 10 using a roll-to-roll process successively. Referring to FIG. 3, the copper clad substrate 10 is wound up around a roller 21 and can be unwound from the roller 21 successively. During manufacturing of the printed circuit boards, the copper clad substrate 10 is transmitted at a constant speed to arrive at each processing device to be treated. A transmitting speed is in a range from 0.1 meters per minute to 5 meters per minute.

It is noted that, if the copper clad substrate 10 is a flexible/rigid sheet substrate, the printed circuit boards can be made of the copper clad substrate 10 using a typical sheet-by-sheet process.

Step 2: Referring to FIG. 3, a surface of the copper layer 12 of the copper clad substrate 10 is roughened by applying an atmospheric pressure plasma 31 thereto.

Referring to FIG. 3, the copper clad substrate 10 is unwound from the roller 21 at a constant speed and is transmitted to an atmospheric pressure plasma generator 30 so as to treat the surface of the copper layer 12 of the copper clad substrate 10. During the surface treatment, the copper clad substrate 10 is located below the atmospheric pressure plasma generator 30 and passes through the atmospheric pressure plasma generator 30 successively.

The atmospheric pressure plasma generator 30 is configured for generating the atmospheric pressure plasma 31 and spraying the atmospheric pressure plasma 31 to the surface of the copper layer 12 of the copper clad substrate 10. The atmospheric pressure plasma 31 does not require any vacuum environment, and provides treatment for various surfaces at low temperatures while being exposed to the atmosphere. Thus, the atmospheric pressure plasma 31 seldom has ions, electrons, and neutral particles with high energy. The atmospheric pressure plasma 31 is useful for treating and modifying the surface properties of materials without damaging the surface properties. The atmospheric pressure plasma 31 can be selected from a group consisting of a nitrogen plasma, an oxygen plasma, an inert gases plasma (e.g., an argon plasma or a helium plasma) and an air plasma.

In the present embodiment, the atmospheric pressure plasma generator 30 provides the tape-shaped atmospheric pressure plasma 31. A width of the atmospheric pressure plasma 31 is equal to that of the copper clad substrate 10 and in a range from 20 millimeters to 75 millimeters. When the copper clad substrate 10 passes through the atmospheric pressure plasma generator 30, the generated atmospheric pressure plasma 31 is sprayed onto the surface of the copper layer 12 to act on the anti-oxidation film or the organic contaminations without damaging the surface of the copper layer 12.

When the atmospheric pressure plasma 31 reacts with the anti-oxidation film, the atmospheric pressure plasma 31 breaks macromolecule chains of the anti-oxidation film, thereby roughening the surface of the copper layer 12. Similarly, when the atmospheric pressure plasma 31 reacts with the organic contaminations, the atmospheric pressure plasma 31 breaks molecule chains of the organic contaminations, thereby roughening the surface of the copper layer 12. Thus, the roughened surface of the copper layer 12 has a less liquid contact angle than the surface of the copper layer 12 untreated by the atmospheric pressure plasma 31.

In the present embodiment, After the generated atmospheric pressure plasma 31 is sprayed onto the surface of the copper layer 12 to react with the anti-oxidation film or the organic contaminations on the surface of the copper layer 12, the roughened surface of the copper layer 12 has a less liquid contact angle than the surface of the copper layer 12 untreated by the atmospheric pressure plasma 31. A decrease degree of the liquid contact angle is in a range from 70 degrees to 90 degrees.

Step 3: a photoresist layer is formed on the surface of the copper layer 12.

In the present embodiment, after the copper clad substrate 10 is treated with the atmospheric pressure plasma 31, the copper clad substrate 10 is transmitted into a wet process of applying a liquid photoresist on the surface of the copper layer 12 to form a photoresist layer. Because the roughened surface of the copper layer 12 has a less liquid contact angle than the untreated surface of the copper layer 12, for example, the liquid contact angle decreases from 110.48 degrees to 20.87 degrees, an affinity of the liquid photoresist to the surface of the copper layer 12 increases. Thus, the liquid photoresist can easily spread on and wet the surface of the copper layer 12, thereby forming the photoresist layer tightly contacting the surface of the copper layer 12.

It is noted that the photoresist layer can be formed with a dry photoresist film. Because the roughened surface of the copper layer 12 has a lager surface roughness than the untreated surface of the copper layer 12, an adhesion between the dry photoresist film and the surface of the copper layer 12 increases. Thus, the dry photoresist film can easily adhere to and laminate on the surface of the copper layer 12, thereby forming the photoresist layer tightly contacting the surface of the copper layer 12.

Step 4: the photoresist layer is exposed.

After the photoresist layer being coated on the copper clad substrate 10, the copper clad substrate 10 having the photoresist layer thereon is transmitted into a process of exposing. When the photoresist layer is composed of a positive resist, portions of the photoresist layer that is exposed to light become soluble to a developing agent and portions of the photoresist layer that is unexposed remain insoluble to the developing agent. When the photoresist layer is composed of a negative resist, portions of the photoresist layer that is exposed to light become relatively insoluble to the developing agent. The unexposed portions of the photoresist layer is dissolved by the developing agent.

Step 5: the photoresist layer is developed to form a patterned photoresist layer, thereby exposing portions of the copper layer 12.

After the photoresist layer coated on the copper clad substrate 10 is exposed, the copper clad substrate 10 having the photoresist layer thereon is transmitted into a wetting process of developing the pattern of the photoresist layer so as to form the patterned photoresist layer on the copper layer 12. Thus, the portions of the copper layer 12 are exposed from the patterned photoresist layer. The developing agent is an alkali solution. A concentration of the alkali solution is in a range from 2% to 5%. The alkali solution can be selected from a group consisting of a sodium carbonate solution, a sodium hydroxide solution and a potassium hydroxide solution.

Advantageously, the surface of the photoresist layer is roughened before the formation of the patterned photoresist layer. In detail, the copper clad substrate 10 is transmitted to the atmospheric pressure plasma generator 30 at a constant speed so that the surface of the photoresist layer on the copper layer 12 can be treated by the generated atmospheric pressure plasma 31. When the atmospheric pressure plasma 31 is sprayed on the surface of the photoresist layer on the copper layer 12, the atmospheric pressure plasma 31 breaks macromolecule chains of the photoresist, thereby increasing a roughness of the surface of the photoresist layer. Because the treated surface of the photoresist layer has a less liquid contact angle than the untreated surface of the photoresist layer, an affinity of the developing agent to the surface of the photoresist layer increases. Thus, the developing agent can easily spread on and wet the surface of the photoresist layer, thereby increasing reaction efficiency of the developing agent and the photoresist, and pattern precision of the patterned photoresist layer.

Step 6: the exposed portions of the copper layer 12 are removed.

After the patterned photoresist layer is formed, the copper clad substrate 10 having the patterned photoresist layer thereon is transmitted into a wet process of etching the exposed portions of the copper layer 12 so that the remaining portions of the copper layer 12 forms the electrical traces. The etchant can be an acid etchant, for example, an acid copper chloride solution. The acid copper chloride solution is composed of copper chloride ($CuCl_2$), hydrochloric acid (HCl) and hydrogen peroxide ($H_2O_2$).

Organic contaminations in the air and the machine can contaminate the surface of the portions of the copper layer 12 exposed from the pattern photoresist layer during transmitting. Moreover, if the surface of the copper layer 12 is not treated by the atmospheric pressure plasma 31 before forming the photoresist layer, the anti-oxidation film can still exist on the surface of the exposed portions of the copper layer 12. Advantageously, before etching the exposed portions of the copper layer 12, the copper clad substrate 10 is transmitted to the atmospheric pressure plasma generator 30 at a constant speed so that the surface of the exposed portions of the copper layer 12 can be treated by the atmospheric pressure plasma 31.

When the atmospheric pressure plasma 31 acts on the surface of the exposed portions of the copper layer 12, the atmospheric pressure plasma 31 breaks macromolecule chains of the organic comtaminations or the anti-oxidation film, thereby increasing a roughness of the surface of the exposed portions of the copper layer 12. Because the roughened surface of the exposed portions of the copper layer 12 has a less liquid contact angle than the untreated surface of the exposed portions of the copper layer 12, an affinity of the etchant to the surface of the exposed portions of the copper layer 12 increases. Thus, the etchant can easily spread on and wet the surface of the exposed portions of the copper layer 12, thereby increasing reaction efficiency of the etchant and copper, and improving precision of the electrical traces.

Meanwhile, the atmospheric pressure plasma 31 can react with the surface of the patterned photoresist layer so that the surface of the patterned photoresist layer on the copper layer 12 is roughened by the generated atmospheric pressure plasma 31. Because the atmospheric pressure plasma 31 seldom has ions, electrons, and neutral particles with high energy, the atmospheric pressure plasma 31 will not damage the patterned photoresist layer, but only breaks macromolecule chains of the photoresist on the surface. Thus, a roughness of the surface of the patterned photoresist layer increases, which is helpful for removing the patterned photoresist layer.

Step 7: the patterned photoresist layer is removed.

After the electrical traces is formed, the copper clad substrate 10 is transmitted into a wet process of removing the patterned photoresist layer. The removing agent can be an alkali solution. A concentration of the alkali solution is in a range from 2% to 5%. The alkali solution can be selected from a group consisting of a sodium carbonate solution, a sodium hydroxide solution and a potassium hydroxide solution.

Advantageously, upon the condition where the copper clad substrate 10 does not receive treatment from the atmospheric pressure plasma 31 before removing the exposed portions of the copper layer 12, the copper clad substrate 10 is transmitted to the atmospheric pressure plasma generator 30 at a constant speed. Thus, the surface of the patterned photoresist layer is treated by the atmospheric pressure plasma 31 before removing the patterned photoresist layer. The atmospheric pressure plasma 31 breaks macromolecule chains of the photoresist, thereby increasing a roughness of the surface of the patterned photoresist layer. Because the treated surface of the patterned photoresist layer has a less liquid contact angle than the untreated surface of the patterned photoresist layer, an affinity of the removing agent to the surface of the patterned photoresist layer increases. Thus, the removing agent can easily spread on and wet the surface of the patterned photoresist layer, thereby increasing reaction efficiency of the removing agent and the photoresist, and removing the patterned photoresist layer completely.

After the electrical traces is formed, the following wet processes including printing legend, electroplating gold, printing solder resist, and so on, can be performed selectively using the roll-to-roll process. It is noted that the atmospheric pressure plasma 31 can be applied onto a surface of the copper clad substrate 10 that will be treated prior to each of the wetting processes. The method can improve performance of the surface of the copper clad substrate that will be treated, thereby decreasing a liquid contact angle of the surface of the copper clad substrate that will be treated. Thus, the treatment liquid can spread on and wet the surface of the copper clad substrate that will be treated completely. The treatment liquid can acts on the surface in a high efficiency. Therefore, quality of the printed circuit board manufactured using these wet processes can be improved.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A method for manufacturing a printed circuit board, comprising the steps of:
   providing a copper clad substrate comprising an insulating base film and a copper layer thereon;
   roughening a surface of the copper layer by applying an atmospheric pressure plasma thereto;
   forming a photoresist layer on the roughened surface of the copper layer;
   exposing the photoresist layer;
   developing the photoresist layer to form a patterned photoresist layer, thereby exposing portions of the copper layer;
   removing the exposed portions of the copper layer so that the remaining portions of the copper layer form electrical traces; and
   removing the patterned photoresist layer;
   wherein, before the step of developing the photoresist layer to form a patterned photoresist layer, a surface of the photoresist layer on the copper layer is roughened by applying an atmospheric pressure plasma thereto.

2. The method as claimed in claim 1, wherein before the step of removing the exposed portions of the copper layer, a surface of the exposed portions of the copper layer and a surface of the patterned photoresist layer on the copper layer are roughened by applying an atmospheric pressure plasma thereto.

3. The method as claimed in claim 1, wherein before the step of removing the patterned photoresist layer, a surface of the patterned photoresist layer on the copper layer is roughened by applying an atmospheric pressure plasma thereto.

4. The method as claimed in claim 1, wherein the copper clad substrate is formed using a sheet-by-sheet process.

5. The method as claimed in claim 1, wherein the atmospheric pressure plasma is a tape shaped.

6. The method as claimed in claim 1, wherein the photoresist layer is selected from a group consisting of a liquid photoresist layer and a dry photoresist layer.

7. The method as claimed in claim 1, wherein the atmospheric pressure plasma is selected from a group consisting of a nitrogen plasma, an oxygen plasma, an inert gases plasma and an air plasma.

8. The method as claimed in claim 7, wherein the inert gases are selected from a group consisting of an argon plasma or a helium plasma.

9. The method as claimed in claim 1, wherein the copper clad substrate is formed using a roll-to-roll process.

10. The method as claimed in claim 9, wherein the copper clad substrate is unwound from a first roller at a constant speed.

11. The method as claimed in claim 10, wherein the speed is in a range from 0.1 meters per minute to 5 meters per minute.

12. A method for manufacturing a printed circuit board using a copper clad substrate comprising a copper layer, the method comprising:
 (1) forming a photoresist layer on the surface of the copper layer;
 (2) developing the photoresist layer to form a patterned photoresist layer, thereby exposing portions of the copper layer;
 (3) removing the exposed portions of the copper layer so that the remaining portions of the copper layer form electrical traces; and
 (4) removing the patterned photoresist layer;
 wherein at least one of the steps (1) to (4) is involved in wet processes, an atmospheric pressure plasma is applied onto a surface of the copper clad substrate prior to each of the steps (1) to (4) which is involved in the wet processes.

13. The method as claimed in claim 12, wherein the atmospheric pressure plasma is selected from a group consisting of a nitrogen plasma, an oxygen plasma, an inert gases plasma and an air plasma.

14. The method as claimed in claim 13, wherein the inert gases plasma is selected from a group consisting of an argon plasma or a helium plasma.

15. A method for manufacturing a printed circuit board, comprising the steps of:
 providing a copper clad substrate comprising an insulating base film and a copper layer thereon;
 roughening a surface of the copper layer by applying an atmospheric pressure plasma thereto;
 forming a photoresist layer on the roughened surface of the copper layer;
 exposing the photoresist layer;
 developing the photoresist layer to form a patterned photoresist layer, thereby exposing portions of the copper layer;
 removing the exposed portions of the copper layer so that the remaining portions of the copper layer form electrical traces; and
 removing the patterned photoresist layer;
 wherein, before the step of removing the exposed portions of the copper layer, a surface of the exposed portions of the copper layer and a surface of the patterned photoresist layer on the copper layer are roughened by applying an atmospheric pressure plasma thereto.

16. The method as claimed in claim 15, wherein the copper clad substrate is formed using a sheet-by-sheet process.

17. The method as claimed in claim 15, wherein the copper clad substrate is formed using a roll-to-roll process.

18. The method as claimed in claim 17, wherein the copper clad substrate is unwound from a first roller at a constant speed.

19. The method as claimed in claim 18, wherein the speed is in a range from 0.1 meters per minute to 5 meters per minute.

\* \* \* \* \*